United States Patent [19]

Peters et al.

[11] Patent Number: 5,872,696
[45] Date of Patent: Feb. 16, 1999

[54] SPUTTERED AND ANODIZED CAPACITORS CAPABLE OF WITHSTANDING EXPOSURE TO HIGH TEMPERATURES

[75] Inventors: Michael G. Peters, Santa Clara; Michael G. Lee, San Jose; Solomon I. Beilin, San Carlos; Yasuhito Takahashi, San Jose, all of Calif.

[73] Assignee: Fujitsu Limited, Japan

[21] Appl. No.: 826,980

[22] Filed: Apr. 9, 1997

[51] Int. Cl.$^6$ .......................... H01G 4/008; H01G 4/06; B05D 5/12

[52] U.S. Cl. .................. 361/305; 361/311; 361/313; 361/322; 361/321.5; 427/79; 427/419.3

[58] Field of Search ................... 361/305, 311, 361/312–313, 314, 321.1–321.5, 322, 508–509, 528–529; 428/209; 204/192.1, 192.14; 257/303, 306, 310, 532; 427/79, 383.3, 419.3; 438/240, 239, 250, 253, 243, 381, 386

[56] References Cited

U.S. PATENT DOCUMENTS

| | | | |
|---|---|---|---|
| 3,231,479 | 1/1966 | Gordon et al. | 204/38 |
| 3,553,545 | 1/1971 | Gerstenberg et al. | 317/258 |
| 3,568,014 | 3/1971 | Schuermeyer | 317/258 |
| 3,579,063 | 5/1971 | Wasa et al. | 317/258 |
| 3,671,823 | 6/1972 | Pitetti et al. | 317/258 |
| 3,779,689 | 12/1973 | Bodway | 317/258 |
| 3,969,197 | 7/1976 | Tolar et al. | 204/15 |
| 4,020,222 | 4/1977 | Kausche et al. | 428/209 |
| 4,058,445 | 11/1977 | Anders | 204/192 |
| 4,089,039 | 5/1978 | Young | 361/322 |
| 4,460,938 | 7/1984 | Clei | 361/411 |
| 4,496,435 | 1/1985 | Harada et al. | 204/15 |
| 5,005,102 | 4/1991 | Larson | 361/313 |
| 5,111,355 | 5/1992 | Anand et al. | 361/313 |
| 5,195,018 | 3/1993 | Kwon et al. | 361/313 |

OTHER PUBLICATIONS

McLean, D.A. et al., "Tantalum–Film Technology," *Proceedings of the IEEE*, Dec., 1964, pp. 1450–1462.

Gerstenberg, D., "Properties of Anodic Films Formed on Reactively Sputtered Tantalum," *J. Electrochem. Soc.*, Jun., 1966, pp. 542–547.

Pringle, J.P.S., "Transport Numbers of Metal and Oxygen during the Anodic Oxidation of Tantalum," *J. Electrochem. Soc.*, Mar., 1973, pp. 398–407.

Worobey, et al., "Tantalum Thin–Film RC Circuit Technology for a Universal Active Filter," *IEEE Transactions on Parts, Hybrides, and Packaging*, vol. PHP–12, No. 4, Dec., 1976, pp. 276–282.

Peters, F.G., et al., "Reverse Bias Life Test Stability of Tantalum–Titanium Anodic Oxide Thin Film Capacitors," *J. Electrochem. Soc.*, vol. 124, No. 6, Jun., 1977, pp. 949–951.

Wittmer, Marc, "High–Temperature Contact Structures for Silicon Semiconductor Devices," *Appl. Phys. Lett.*, vol. 37, No. 6, Sep. 15, 1980, pp. 540–542.

(List continued on next page.)

*Primary Examiner*—Bot L. Ledynh
*Assistant Examiner*—Anthony Dinkins
*Attorney, Agent, or Firm*—Coudert Brothers

[57] ABSTRACT

Novel structures for capacitors which are capable of withstanding heat treatments to at least 400° C. while providing low defect densities and low electrical series resistance in its electrodes are disclosed. In one embodiment of the present invention, a capacitor structure includes a bottom capacitor electrode formed of a first sub-layer of aluminum, a second sub-layer of tantalum nitride, and a third sub-layer of tantalum. The capacitor structure further includes a sputtered dielectric layer of tantalum pentoxide over the tantalum sub-layer of the bottom electrode. The resulting structure is anodized such that the underlying tantalum layer is fully anodized, and preferably such that a portion of the tantalum nitride layer is converted to a tantalum oxy-nitride. The tantalum nitride layer was discovered by the inventors to act as a good high temperature diffusion barrier for the aluminum, preventing the aluminum from migrating into the anodized tantalum pentoxide layer under high temperature processing conditions, where it would chemically reduce the tantalum atoms in the tantalum pentoxide layer and introduce conductive paths of tantalum in the dielectric (tantalum pentoxide) layer. The aluminum layer provides good electrical conductivity for the bottom electrode, and is anodized to fill any pinhole defects in the layers formed above it, thereby increasing manufacturing yields.

32 Claims, 2 Drawing Sheets

OTHER PUBLICATIONS

Wittmer, Marc. "Interfacial Reactions Between Aluminum and Transition–metal Nitride and Carbide Films," *J. Appl. Phys., vol. 53, No. 2,* Feb., 1982, pp. 1007–1012.

Yamada, Keisaku, "Thermodynamical Approach to a New High Dielectric Capacitor Structure: W/HfO$_2$W," *Extended Abstracts of the 18$^{th}$ (1986 International) Conference on Solid State Devices and Materials,* Tokyo, 1986, pp. 257–260.

Mehrotra et al., "Properties of Direct Current Magnetron Reactivity Sputtered TaN," *J. Vac. Sci. Technol., B5(6),* Nov./Dec. 1987, pp. 1736–1740.

Byeon, S.G. et al., "High Performance Sputtered/Anodized Tantalum Oxice Capacitors," *IEEE, IEDM 88,* pp. 722–725, 1988.

Dobashi, T., "Influence of the Ta Migration on Dielectric Properties of Anodized Al–Ta(N)–Al Trilayered Oxide Films," *Electronics and Communications in Japan, Part 2, vol. 72, No. 9,* 1989, pp. 21–28.

Farooq, M.A. et al., "Tantalum Nitride as a Diffusion Barrier Between Pd$_2$Si CoSi$_2$ and Aluminum," *J. Appl. Phys., vol. 65, No. 8,* Apr. 15, 1989, pp. 3017–3022.

Matsuhashi et al., "Optimum Electrode Materials for Ta$_2$O$_5$ Capacitors at High and Low Temperature Processes," *Extended Abstracts of the 1993 International Conference on Solid State Devices and Materials,* 1993, pp. 853–855.

Kambe et al., "MCM Substrate with High Capacitance," *MCM '94 Proceedings,* pp. 136–141, 1994.

Sun et al., "A Novel Approach for Leakage Current Reduction of LPCVD Ta$_2$O$_5$ Films by Rapid Thermal N$_2$O Annealing," *IEEE, IEDM 94,* 1994, pp. 333–336.

Paik et al., "Thin Film Integral Capacitor Fabricated on a Polymer Dielectric for High Density Interconnect (HDI) Applications," *Mat. Res. Soc. Symp. Proc., vol. 390,* 1995, pp. 33–38.

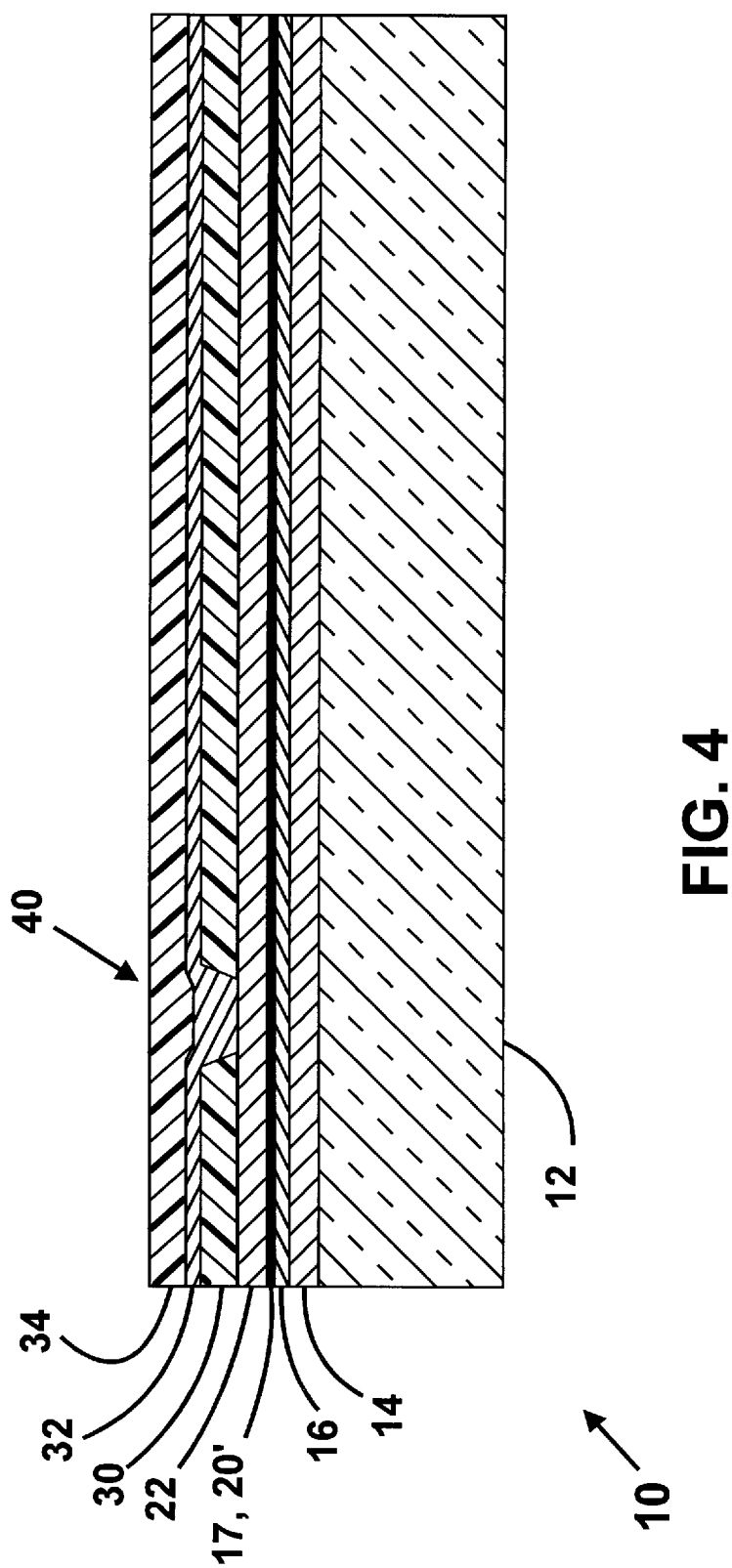

SPUTTERED AND ANODIZED CAPACITORS CAPABLE OF WITHSTANDING EXPOSURE TO HIGH TEMPERATURES

FIELD OF THE INVENTION

The present invention relates to the formation of sputtered and/or anodized capacitors, and more particularly to such capacitors which can withstand exposures to high temperatures of at least 400° C. without a substantial degradation in the leakage current of the capacitor.

BACKGROUND OF THE INVENTION

As the clock rates and the IC density increase in multichip modules (MCMs), power supply noise becomes a more serious problem. It becomes more desirable to position decoupling capacitors closer to the chips and therefore to more effectively isolate the active devices from the switching transients because of the reduced inductance that comes with closer positioning. Approaches to accomplish this include either incorporating a thin film capacitor structure into the multichip module as an integral capacitor or placing the decoupling capacitors between the chip and multichip module, such as on interposer substrates.

One drawback of using decoupling capacitors disposed on interposer substrates is that the amount of chip assembly is doubled. Another drawback is that the chances of solder bump failure can be doubled. A thin film capacitor which is integrated into the body of the multichip module would not have these drawbacks, and therefore is appealing. However, the manufacturing of integrated thin film capacitors faces several technological hurdles before these capacitors can be reliable and economical.

More specifically, an integral capacitor needs to be compatible with the dielectric and metal layers used in the multichip module, and with the processing steps used to form these layers. Therefore, the processing conditions and temperatures used to fabricate the integrated capacitor must not degrade the dielectric and metal layers, and, conversely, the integrated capacitor must have sufficient thermal stability such that its electrical characteristics are not degraded by the formation of the dielectric and metal layers. For example, the formation of a conventional copper-polyimide multichip module requires that each polyimide layer be cured at a high temperature of 300° C. to 450° C. for 30 minutes to 2 hours, depending upon the thickness and chemical composition of the polyimide layer, which would expose an integrated capacitor structure to several extended periods at high temperature.

Additionally, because the integrated capacitor is formed over a large area, defect density of the thin film integrated capacitor is an important characteristic and must be reduced to increase reliability and manufacturing yields. Furthermore, the capacitor should have as high a capacitance value as possible to be the most effective, which requires the use of a high dielectric constant material and/or the use of a very thin dielectric layer. Unfortunately, the use of thin dielectric layers significantly increases defect densities. The use of an anodization material to form the capacitor's dielectric layer offers significant advantages over other formation techniques. Such materials generally provide the highest dielectric constants available for capacitor materials, and the anodization process heals many (but not all) types of defects and enables the dielectric layer to be formed in a controlled and uniform manner. Unfortunately, the base material used to form the anodized oxide dielectric readily diffuses into the dielectric layer when both layers are subjected to high temperatures of 300° C. and above, which is used in the above-described polyimide curing step. The diffusion of the metal creates conductive paths through the dielectric layer, which in turn significantly increases the leakage current of the capacitor. This problem poses a formidable obstacle to successfully manufacturing integrated capacitors.

As an additional consideration, the series resistance in the electrodes of the integrated capacitor needs to be kept low to avoid voltage drops across the capacitor during transient current spikes, and to improve transient response time. This consideration complicates the resolution of the above more serious issues by limiting the available options, and may introduce yet additional problems. As an example of such an additional problem, many researchers have tried to construct a capacitor with aluminum (Al) electrodes for good conductivity and a tantalum pentoxide ($Ta_2O_5$) dielectric layer for a high dielectric constant. However, these researchers found that the aluminum chemically reacted with the tantalum pentoxide when the capacitor was heated to 300° C. and significantly increased the leakage current of the capacitor.

Many multichip modules have addressed these challenges by making careful trade-offs between the performance of the module and the performance of the integrated capacitor. For example, thicker dielectric layers in the integrated capacitor have been used to reduce the degradation effects of temperature on the capacitor. However, thicker dielectrics result in lower capacitance, and therefore lower ability to filter out transient current spikes in the power supply. As another trade-off, curing temperatures for the polyimide layers have been reduced. However, the reduced temperature results in a more lossy polyimide dielectric layer, which degrades the performance of the signal lines in the module.

The present invention seeks a way in which these trade-offs can be minimized or avoided so that the electrical performance of the integrated capacitor and the signal lines of the module can be equally maximized.

SUMMARY OF THE INVENTION

In making their invention, the inventors have recognized that the base metal used to construct an anodized metal oxide migrates, or diffuses, into the metal oxide layer when heated to temperatures above 300° C. for extended periods of time. The inventors have found that capacitor structures in which the bottom electrode has been replaced with a different anodizable metal suffer the same metal migration problem, with the different metal often diffusing into the metal oxide layer during anodization, and/or chemically reducing the metal in the metal oxide so that the chemically reduced metal diffuses into the metal oxide layer. Such metal diffusion degrades the electrical properties of the dielectric layer by creating conduction paths, on the microscopic scale, through the metal-oxide dielectric layer. Although it is possible that some nonanodizable metals might not diffuse into anodized metal oxide layers and might not chemically reduce such metal oxide layers, and would therefore look like attractive alternatives, the inventors have found that the use of these non-anodizable metals as bottom electrodes precludes the use of the anodization process as a practical matter. This is because the material deposited on top of the non-anodizable metal to form the capacitor dielectric often has microscopic pin holes which expose the non-anodizable metal layer during the anodization process. The exposed portions of the non-anodizable material act as electrical short circuits to the anodization process, which causes all of the anodization current to flow through the shorts rather than to the deposited anodizable material.

The present invention encompasses novel structures which are capable of withstanding heat treatments to at least 400° C. while providing low defect densities and low electrical series resistance in its electrodes. In one embodiment of the present invention, a capacitor structure comprises a bottom capacitor electrode formed of a first sub-layer of aluminum, a second sub-layer of tantalum nitride, and a third sub-layer of tantalum. The capacitor structure further comprises a sputtered dielectric layer of tantalum pentoxide over the tantalum sub-layer of the bottom electrode. The resulting structure is anodized such that the underlying tantalum layer is fully anodized, and preferably such that a portion of the tantalum nitride layer is converted to a tantalum oxy-nitride. The anodization of the tantalum pentoxide corrects stoichiometric defects caused by the sputtering operation; such defects lead to increased leakage current. The anodization of the precursor tantalum layer cures pin-hole defects in the tantalum pentoxide layer, thereby further reducing leakage current and increasing manufacturing yield. The tantalum nitride layer was discovered by the inventors to act as a good high temperature diffusion barrier for the aluminum, preventing the aluminum from migrating into the anodized tantalum pentoxide layer under high temperature processing conditions, where it would chemically reduce the tantalum atoms in the tantalum pentoxide layer and introduce conductive paths of tantalum in the dielectric (tantalum pentoxide) layer. The aluminum layer provides good electrical conductivity for the bottom electrode, and is anodized to fill any pinhole defects in the layers formed above it, thereby increasing manufacturing yields.

Accordingly, it is an object of the present invention to provide a thin film capacitor structure with low defect densities and which can withstand high temperature processing conditions without a substantial degradation in electrical properties.

This and other objects of the present invention will become apparent to those skilled in the art from the following detailed description of the invention, the accompanying drawings, and the appended claims.

BRIEF DESCRIPTION OF THE DRAWINGS

FIG. 4 is a cross-sectional view of an exemplary capacitor structure with copper and polyimide layers disposed thereon according to the present invention.

DETAILED DESCRIPTION OF THE INVENTION

Figure 1:
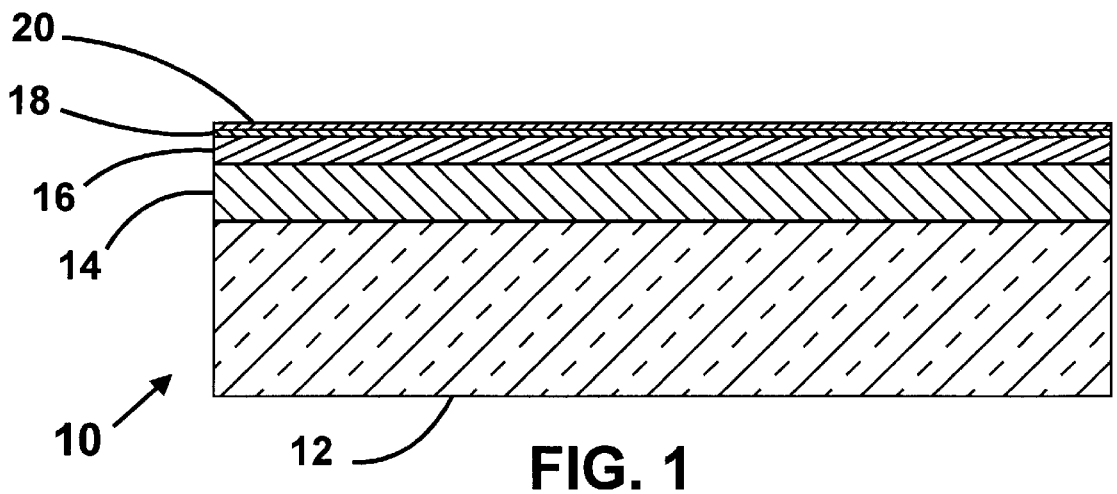
FIG. 1 is a cross-sectional view of an exemplary starting capacitor layer structure prior to anodization according to the present invention.

Referring to FIG. 1, an exemplary capacitor according to the present invention is formed by the following exemplary method according to the present invention. Starting with a silicon substrate 12 having an oxidized top surface, a layer 14 of aluminum is formed over the top surface of substrate 12 to a thickness of between 1 $\mu$m to 3 $\mu$m. Standard deposition processes well known to the art may be used, such as direct-current (D.C.) magnetron sputtering. Other suitable substrate materials may be used, such as molybdenum, alumina, and any of the above substrate materials may be coated with polyimide or other adhesion materials.

Thereafter, 5,000 Å (angstrom) of tantalum nitride (TaN) is sputtered over aluminum layer 14 to form a tantalum nitride layer 16. In one constructed embodiment, a D.C. magnetron system with a tantalum target is used, with the system set at a power level 1.55 kW. The chamber pressure is set to 10 milli-torr (mT), with 75 sccm argon(Ar) and 10 sccm nitrogen ($N_2$) flowing into the sputtering chamber (one sccm is one standard cubic centimeter of gas per minute, and one standard cubic centimeter of gas is measured at 25° C. and one standard atmosphere). Under these conditions, tantalum is sputtered from the target to form tantalum nitride with the nitrogen gas (reactive sputtering), and the tantalum nitride film grows at a rate of approximately 1.33 Å (angstrom) per second. The nitrogen flow rate may be varied between 5 sccm and 15 sccm under the above conditions.

Thereafter, approximately 600 Å (angstrom) of tantalum (T) is sputtered over tantalum nitride layer 16 to form a tantalum layer 18. This step may follow immediately after the sputtering of tantalum nitride layer 16 in the same sputtering chamber and without breaking the vacuum. Preferably, the tantalum is sputtered so that the deposited layer is in the beta form, so called $\beta$-tantalum. This form of tantalum, in contrast with the alpha($\alpha$)-form, has been found to provide better anodized layers, and may be formed by sputtering tantalum in an Argon atmosphere. In one constructed embodiment, a D.C. magnetron system with a tantalum target is used, with the system set at a power level 1.0 kW. No applied substrate bias is used. The chamber pressure is set to 10 milli-torr (mT), with 75 sccm argon(Ar) flowing into the sputtering chamber. Under these conditions, a $\beta$-tantalum film grows at a rate of approximately 1.0 Å (angstrom) per second.

Next, approximately 500 Å (angstrom) of tantalum pentoxide ($Ta_2O_5$) is sputtered over tantalum layer 18 to form tantalum pentoxide layer 20. In one constructed embodiment, an R.F. magnetron system with a tantalum target is used, with the system being set at a power level 1.55 kW. This step may follow immediately after the sputtering of the tantalum layer in the same sputtering chamber and without breaking the vacuum. The chamber pressure is set to 10 milli-torr (mT), with 75 sccm argon(Ar) and 25 sccm oxygen ($O_2$) flowing into the sputtering chamber. At these conditions, the film grows at a rate of approximately 0.2 Å (angstrom) per second.

Figure 2:
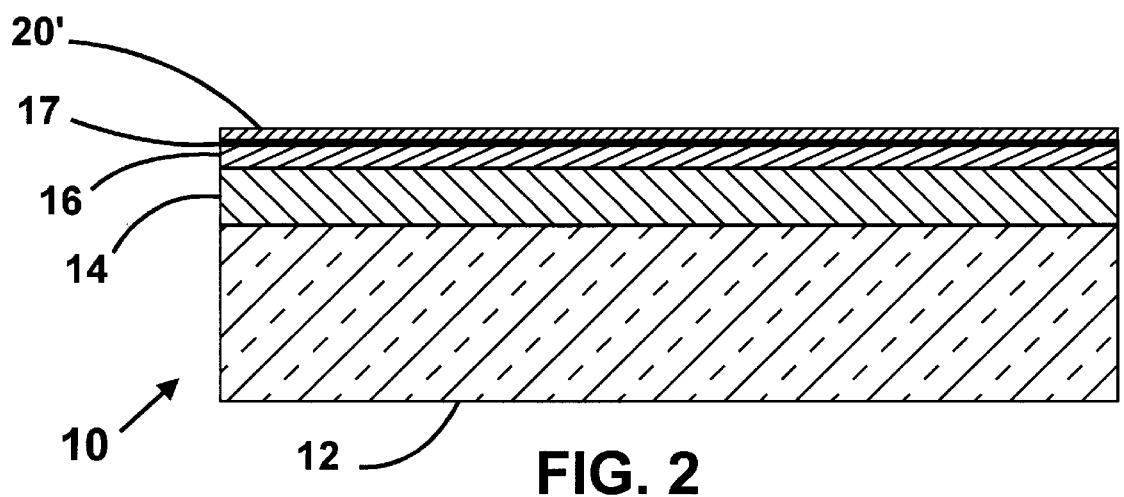
FIG. 2 is a cross-sectional view of the exemplary capacitor layer structure after an anodization step according to the present invention.

The resulting structure is then anodized to correct the stoichiometry of the sputtered tantalum pentoxide layer 20, and to completely anodize the underlying elemental $\beta$tantalum layer 18. Approximately 2,000 Å (angstroms) of tantalum pentoxide ($Ta_2O_5$) results from the anodization, approximately 1,500 Å (angstroms) provided by the anodization of the elemental tantalum layer 18. The resulting capacitor structure is shown in FIG. 2, where layers 18 and 20 have been merged into a common tantalum pentoxide layer 20'. The current, time, and voltage required to anodize the tantalum layer 18 can be readily calculated by the teachings in the anodization art. For tantalum pentoxide, the coulombic efficiency of the anodization process is very close to 100%. Accordingly, the amount of charge required to chemically oxidize a given amount of tantalum can be easily determined, and this amount can be readily measured during the anodization process by time-integrating the anodization current. A common anodization technique uses a constant anodization current, stops after a set time interval to arrive at the charge amount. Other anodization control methods measure the anodization voltage and rely upon the empirical rule that each volt increase in potential results in approximately 16.5 Å increase in oxide thickness.

Figure 3:
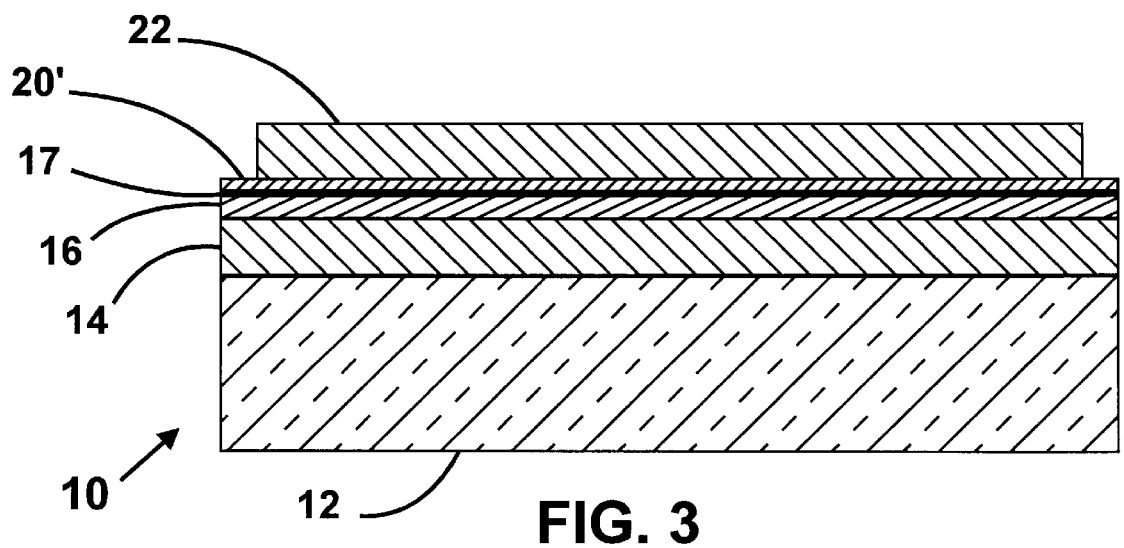
FIG. 3 is a cross-sectional view of an exemplary capacitor structure with a top electrode disposed thereon according to the present invention.

In preferred embodiments of the present invention, the anodization of tantalum layer 18 is carried out such that a portion of the tantalum nitride (TaN) layer 16 is anodized to form a thin tantalum oxy-nitrid ($TaO_xN_y$) layer having a thickness on the order of 200 Å to 400 Å, which is shown as layer 17 in FIGS. 2 and 3. This may be done by running the anodization process past the time computed above by a predetermined amount. Each 100 Å of tantalum oxy-nitride requires approximately 17.5 milli-Coulombs (mC) per square centimeter. Accordingly, the growth of 200 Å to 400 Å of tantalum oxy-nitride can be readily achieved by extending the anodization time by an amount determined by the anodization current and the 17.5 mC/cm² figure (the time for each 100 Å equals $0.0175/I_A$, where $I_A$ is the anodization current per square centimeter).

Preferably, the anodization current is gradually increased at the beginning of the anodization process from zero amperes to a working value over one or more minutes, and thereafter maintained at the working value. The gradual ramping of current enables an orderly diffusion of oxygen species through the sputtered tantalum pentoxide layer 20 before full current is applied. In one practiced embodiment of the present invention, an anodization bath comprising 0.01% citric acid in water is used at 70° C. An anodization current of 0.27 mA/cm² is used, with the current being ramped up to that value from zero amperes over a period of 1.5 minutes in a substantially linear manner. The anodization current is maintained at that level for approximately 18 minutes, after which it is ramped back to zero amperes over a 1.5 minute period in a substantially linear manner.

After anodization, a counter electrode layer 22 is formed over tantalum pentoxide layer 20, as shown in FIG. 3. The counter electrode comprises a material which does not chemically reduce tantalum in the oxide layer 20 up to temperatures of at least 350° C., and preferably up to temperatures of at least 450° C., and more preferably up to temperatures of at least 550° C. The inventors have found that molybdenum (Mo) and tungsten (W) do not chemically reduce the tantalum in $Ta_2O_5$ at temperatures up to at least 550° C., and are suitable choices for layers 20. It may be appreciated that layer 22 may be a composite of materials, with a non-chemically reducing material as a bottom sub-layer. For example, the inventors have used a layer 22 having a bottom layer of tungsten (400 Å), a middle layer of copper (2 μm) for good electrical conduction, and a top layer of chromium (200 Å) for good adhesion to polyimide. In another embodiment, top layer 22 may comprise bottom sub-layer of tantalum nitride and a top sub-layer of copper (or another metal).

With the capacitor structure constructed, copper and polyimide layers may be formed over the capacitor structure to form a multichip module (MCM) with an integrated capacitor within. The MCM structure is shown in FIG. 4, here layers 30 and 34 are polyimide layers, which are cured in the range of 300° C. to 450° C., and where layer 32 comprises copper, or another suitable conductive material. Vias are generally formed between the copper layers and selected electrodes of the capacitor structure, one such via being shown at 40.

In FIGS. 1–4, the vertical dimensions of layers 14, 16, 17, 18, 20, 22, 30, 32, and 34 have been expanded with respect to the vertical dimension of substrate 12 by approximately a factor of 50 to better show the features of these layers.

The arrangement and composition of the above described layers have a number of advantages. First, the sputtered $Ta_2O_5$ layer 20 and its position within the structure provides the final dielectric layer 20' with relatively low leakage current on the microscopic level, much lower than can be achieved from anodizing an elemental tantalum layer. However, sputtered $Ta_2O_5$ layers have a relatively high number of pin-hole defects, on the order of 2 to 5 per square centimeter. When a sputtered $Ta_2O_5$ layer is used alone as the dielectric layer, the pin-hole defects in the sputtered layer create large, and unacceptable, leakage currents, making sputtered $Ta_2O_5$ layers useless for capacitors greater than 0.25 square centimeter. The inventors characterize this by stating that sputtered $Ta_2O_5$ layers have low "microscopic" leakage current (very low in any one small area), but large "macroscopic" leakage currents (very large in any large area).

In contrast, the anodization of tantalum layer 18 has been found to create a dielectric layer with much fewer pin-hole defects, leading to a low macroscopic leakage current, but with a larger microscopic leakage current. It is believed that elemental tantalum migrates through the dielectric layer during the anodization process as the dielectric layer is being created, thereby creating conductive paths through the dielectric layer on a microscopic level. However, since the sputtered $Ta_2O_5$ layer 20 is in series with the anodized product of tantalum layer 18, the overall dielectric layer 20' obtains the benefits of both sub-layers, low microscopic leakage current being provided by layer 20 and low pin-hole defects and low macroscopic leakage current being provided by anodized layer 18. The structure according to the present invention has obtained pin-hole defects lower than 0.02 defects per square centimeter, whereas sputtered $Ta_2O_5$ layers have defects on the order of 5 per square centimeters or more. This represents a reduction in pin-hole defects by a factor of over 250.

In preferred embodiments of the present invention, approximately 25% of the final tantalum pentoxide layer is comprised by sputtered tantalum pentoxide, and approximately 75% is comprised by tantalum pentoxide that is formed by anodizing elemental tantalum. However, the ratio of sputtered oxide and anodized oxide may vary in a preferred range of 50%-sputtered and 50%-anodized, to 10%-sputtered and 90%-anodized. In other embodiments, 100% anodized tantalum pentoxide may be used.

Tantalum nitride layer 16 and its position with the capacitor structure provides a number of advantages. First, the inventors have found tantalum nitride to act as a good high temperature diffusion barrier between aluminum (Al) and tantalum pentoxide ($Ta_2O_5$), preventing aluminum in layer 14 from diffusing into the $Ta_2O_5$ layer 20' during subsequent high temperature processing steps. For this purpose, the thickness of nitride layer 16 is preferably at least 2,000 Å (Angstroms), and more preferably is at least 4,000 Å (Angstroms). Second, tantalum nitride anodizes to fill any pin-hole defects in tantalum layer 16 above it, thereby reducing defect densities in the capacitor structure, and thereby increasing manufacturing yields.

Third, tantalum nitride layer 14 operates in conjunction with the complete anodization of tantalum layer 16 to oxidize the elemental tantalum which has diffused into the $Ta_2O_5$ layer 20' during the anodization of tantalum layer 18. In the conventional prior art formation methods, a tantalum layer would only be partially anodized so that the bottom portion can serve as the capacitor's bottom electrode. During conventional anodization, elemental tantalum is continually released from the metal layer and diffuses through the oxide layer toward the open surface. During the same time, oxygen species diffuse in the reverse direction from the open surface into the oxide layer and toward the substrate. After partial anodization, elemental tantalum remains distributed within the oxide layer, leading to microscopic conduction paths within the oxide layer. In the present invention, the tantalum nitride layer 16 serves as the capacitor's bottom electrode so that tantalum layer 18 may be completely anodized. It is believed by the inventors that, during the anodization of the tantalum nitride layer, elemental tantalum is released from the layer at a much lower rate than that which occurs during the anodization of an elemental tantalum layer. Accordingly, after complete anodization of tantalum layer 18, the release of elemental tantalum into oxide layer 20' is reduced substantially while the tantalum nitride layer is being anodized, which enables the migrating oxygen species to oxidize off the tantalum which has diffused into oxide layer 20', which reduces the microscopic conduction paths caused by the elemental tantalum. Leakage current is thereby improved.

It is believed by the inventors that tantalum oxy-nitride layer 17 provides a number of advantages as well. First, as mentioned above, the formation of oxy-nitride layer ensures that all of the tantalum from layer 18 is completely anodized, thereby reducing leakage currents. Second, the relative dielectric constant of tantalum nitride is sufficiently high, being in the range of 13 to 18, that the formation of the tantalum nitride does not significantly lower the capacitance value of the capacitor, which is determined primarily by the dielectric constant of the tantalum pentoxide, which is approximately 25. In preferred embodiments of the present invention, the thickness of tantalum oxy-nitride layer 17 is at least 75 Å (Angstroms), and more preferably is at least 150 Å. However, because the dielectric constant of the tantalum oxy-nitride is lower than that of tantalum pentoxide, it is preferable to have a thickness of tantalum nitride which is not more than one-half the thickness of the final tantalum pentoxide layer (for example, 2,000 Å/2=1,000 Å), and more preferable to have a thickness which is not more than one-fourth of the thickness of the final tantalum pentoxide thickness (for example, 2,000 Å/4=500 Å).

In order to be a practical integrated bypass capacitor, the leakage current should be below 1 micro ampere per square centimeter of capacitor area at applied voltages of 10 volts (cathodic and anodic). The present invention can achieve leakage currents of less than 0.1 micro-amperes per square centimeter, under both cathodic and anodic polarization conditions, after the capacitor has been exposed to temperatures over 350° C. over several hours.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A capacitor comprising:
   an aluminum (Al) layer;
   a tantalum nitride (TaN) layer formed over said aluminum (Al) layer, said tantalum nitride (TaN) layer having a chemical stoichiometric ratio of approximately one tantalum (Ta) atom per one nitrogen (N) atom;
   a tantalum pentoxide ($Ta_2O_5$) layer formed over said tantalum nitride (TaN) layer; and
   a counter electrode formed over said tantalum pentoxide layer which does not chemically reduce the tantalum in said tantalum pentoxide layer at temperatures above 300° C.

2. The capacitor of claim 1 wherein the thickness of said tantalum nitride layer is at least 2,000 Å (Angstroms).

3. The capacitor of claim 1 wherein the thickness of said tantalum nitride layer is at least 4,000 Å (Angstroms).

4. The capacitor of claim 1 wherein said tantalum pentoxide layer comprises a layer of sputtered tantalum pentoxide.

5. The capacitor of claim 1 wherein said tantalum pentoxide layer is formed by anodizing a precursor layer of elemental tantalum (Ta).

6. The capacitor of claim 5 wherein said precursor layer of elemental tantalum (Ta) comprises tantalum in the beta (β) phase form (β-tantalum).

7. The capacitor of claim 1 wherein said tantalum pentoxide ($Ta_2O_5$) layer comprises a sub-layer of sputtered tantalum pentoxide ($Ta_2O_5$) and a sub-layer of tantalum pentoxide ($Ta_2O_5$) formed by anodizing a precursor layer of elemental tantalum (Ta).

8. The capacitor of claim 1 further comprising a layer of tantalum oxy-nitride ($TaO_xN_y$) formed between said tantalum nitride (TaN) layer and said tantalum pentoxide ($Ta_2O_5$) layer.

9. The capacitor of claim 1 wherein the thickness of said tantalum oxy-nitride layer is at least 75 Å (Angstroms).

10. The capacitor of claim 1 wherein the thickness of said tantalum oxy-nitride layer is at least 150 Å (Angstroms).

11. The capacitor of claim 1 wherein said counter electrode comprises tungsten (W).

12. The capacitor of claim 1 wherein said counter electrode comprises molybdenum (Mo).

13. The capacitor of claim 1 further comprising a layer of polymeric material formed over said counter electrode, said polymeric material being heated to a temperature of at least 300° C.

14. A capacitor comprising:
    a tantalum nitride (TaN) layer having a chemical stoichiometric ratio of approximately one tantalum (Ta) atom per one nitrogen (N) atom;
    a layer of tantalum oxy-nitride ($TaO_xN_y$) layer formed over said tantalum nitride (TaN) layer;
    a tantalum pentoxide ($Ta_2O_5$) layer formed over said tantalum oxy-nitride ($TaO_xN_y$) layer; and
    a counter electrode formed over said tantalum pentoxide layer which does not chemically reduce the tantalum in said tantalum pentoxide layer at temperatures above 300° C.

15. The capacitor of claim 14 wherein said tantalum oxy-nitride layer is formed by anodization.

16. The capacitor of claim 14 wherein the thickness of said tantalum oxy-nitride layer is at least 75 Å (Angstroms).

17. The capacitor of claim 14 wherein the thickness of said tantalum oxy-nitride layer is at least 150 Å (Angstroms).

18. The capacitor of claim 14 wherein the thickness of said tantalum nitride layer is at least 2,000 Å (Angstroms).

19. The capacitor of claim 14 wherein said tantalum pentoxide layer comprises a layer of sputtered tantalum pentoxide.

20. The capacitor of claim 14 wherein said tantalum pentoxide layer is formed by anodizing a precursor layer of elemental tantalum (Ta).

21. The capacitor of claim 20 wherein said precursor layer of elemental tantalum (Ta) comprises tantalum in the beta (β) phase form (β-tantalum).

22. The capacitor of claim 14 wherein said tantalum pentoxide ($Ta_2O_5$) layer comprises a sub-layer of sputtered tantalum pentoxide ($Ta_2O_5$) and a sub-layer of tantalum pentoxide ($Ta_2O_5$) formed by anodizing a precursor layer of elemental tantalum (Ta).

23. The capacitor of claim 14 wherein said counter electrode comprises tungsten (W).

24. The capacitor of claim 14 wherein said counter electrode comprises molybdenum (Mo).

25. The capacitor of claim 14 further comprising a layer of polymeric material formed over said counter electrode, said polymeric material being heated to a temperature of at least 300° C.

26. A capacitor comprising:
   a layer of a first metal;
   a nitride layer of a second metal, said second metal being different from said first metal, said nitride layer being formed over said first metal layer;
   an oxy-nitride layer of said second metal, formed over said nitride layer by anodization;
   an oxide layer of said second metal formed by completely anodizing a precursor elemental layer; and
   a metal counter electrode formed over said oxide layer which does not chemically reduce the second metal in said oxide layer at temperatures above 300° C.

27. A method of fabricating a capacitor comprising the steps of:
   (a) forming a layer of aluminum (Al) over a substrate;
   (b) forming a layer of tantalum nitride (TaN) over said layer of aluminum, said tantalum nitride (TaN) layer having a chemical stoichiometric ratio of approximately one tantalum (Ta) atom per one nitrogen (N) atom;
   (b) forming a layer of tantalum (Ta) over said layer of tantalum nitride (TaN); and
   (d) completely anodizing said tantalum (Ta) layer to form a tantalum pentoxide ($Ta_2O_5$) layer.

28. The method of claim 27 further comprising the steps of:
   (e) forming a counter electrode over said tantalum pentoxide ($Ta_2O_5$) layer; and
   (f) forming a layer of polymeric material over said counter electrode, said polymeric material being heated to a temperature of at least 300° C.

29. A method of fabricating a capacitor comprising the steps of:
   (a) forming a layer of tantalum nitride (TaN) over a substrate, said tantalum nitride (TaN) layer having a chemical stoichiometric ratio of approximately one tantalum (Ta) atom per one nitrogen (N) atom;
   (b) forming a layer of tantalum (Ta) over said layer of tantalum nitride (TaN);
   (c) completely anodizing said tantalum (Ta) layer to form a tantalum pentoxide ($Ta_2O_5$) layer; and
   (d) partially anodizing said tantalum nitride (TaN) layer such that a layer of tantalum oxy-nitride ($TaO_xN_y$) layer is formed between said tantalum pentoxide ($Ta_2O_5$) layer and the remainder of the un-anodized tantalum nitride (TaN) layer.

30. The method of claim 29 further comprising the steps of:
   (e) forming a counter electrode over said tantalum pentoxide ($Ta_2O_5$) layer; and
   (f) forming a layer of polymeric material over said counter electrode, said polymeric material being heated to a temperature of at least 300° C.

31. A method of fabricating a capacitor comprising the steps of:
   (a) forming a first anodizable metal layer over a substrate;
   (b) forming a metal-nitride layer over said first anodizable metal layer;
   (c) forming a second anodizable metal layer over said metal-nitride layer, the metal of said second anodizable metal layer being the same as the metal in the metal-nitride layer;
   (d) completely anodizing said second anodizable metal layer to form a metal-oxide layer; and
   (e) partially anodizing said metal-nitride layer such that a metal oxy-nitride layer is formed between said metal-oxide layer and the remainder of metal-nitride layer.

32. The method of claim 31 further comprising the step of forming a counter electrode over said metal-oxide layer, said counter electrode comprising a metal which does not chemically reduce the metal in said metal-oxide layer at temperatures above 300° C.

* * * * *

UNITED STATES PATENT AND TRADEMARK OFFICE
CERTIFICATE OF CORRECTION

PATENT NO. : 5,872,696
DATED : February 16, 1999
INVENTOR(S) : Peters et al.

It is certified that error appears in the above-identified patent and that said Letters Patent is hereby corrected as shown below:

Column 5, line 8, delete "oxy-nitrid" and substitute therefor --oxy-nitride--.

Column 5, line 57, delete "here" and substitute therefor --where--.

Column 8, line 45, delete "layer of".

Column 10, line 16, delete "layer".

Signed and Sealed this

Twenty-sixth Day of October, 1999

Attest:

Attesting Officer

Q. TODD DICKINSON

Acting Commissioner of Patents and Trademarks